(12) United States Patent
Kimura et al.

(10) Patent No.: US 6,396,290 B1
(45) Date of Patent: May 28, 2002

(54) TEST CARRIER AND METHOD OF MOUNTING SEMICONDUCTOR DEVICE THEREON

(75) Inventors: Takahiro Kimura; Michinobu Tanioka, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/472,158

(22) Filed: Dec. 27, 1999

(30) Foreign Application Priority Data

Dec. 28, 1998 (JP) .......................................... 10-373211

(51) Int. Cl.⁷ .............................................. G01R 31/02
(52) U.S. Cl. ....................................................... 324/755
(58) Field of Search ................................ 324/754, 755, 324/765, 758; 439/66, 71, 73, 482, 83, 67, 74; 361/760, 769, 767; 228/179.1, 180.22; 174/250

(56) References Cited

U.S. PATENT DOCUMENTS 5,563,521 A * 10/1996 Crumly ....................... 324/757

6,170,155 B1 * 1/2001 Marion et al. ................. 29/840

FOREIGN PATENT DOCUMENTS

JP          10-65069         3/1998

* cited by examiner

Primary Examiner—N. Le
Assistant Examiner—Etienne LeRoux
(74) Attorney, Agent, or Firm—Whitman, Curtis & Christofferson, P.C.

(57) ABSTRACT

A test carrier according to the present invention can materialize stable contact between electrode bumps of a semiconductor device and a contact sheet no matter where the electrode bumps are. The test carrier comprises a contact sheet 4 disposed on a carrier base 1 and having bumps 50 in contact with and connected to electrode pads on the surface of the semiconductor device and external electrodes 48 for testing, a pressing member 6 for applying predetermined contact pressure between the electrode pads and the bumps 50, and a securing member 70 for securing the contact sheet on the carrier base. The center of thermal expansion of the contact sheet secured by the securing member 70 is offset from all the bumps 50. Further, the securing member 70 secures the carrier base and the contact sheet at two or more securing points, and the center of a figure formed by linking the securing points is offset from the bumps 50.

24 Claims, 12 Drawing Sheets

TEST CARRIER AND METHOD OF MOUNTING SEMICONDUCTOR DEVICE THEREON

BACKGROUND OF THE INVENTION

1. Field of the Invention

The present invention relates to a test carrier used when a semiconductor device having terminals on its surface such as a bare chip is tested, and more particularly, to a test carrier with less thickness and with improved connectability and to a method of mounting a semiconductor device on the test carrier.

2. Description of the Related Art

Conventionally, a test carrier is structured to receive a semiconductor device such as a bare chip such that the electric characteristics of the bare chip (semiconductor device) can be tested with the chip being handled similarly to a packaged product.

As disclosed in Japanese Patent Application Laid-open No. Hei 10-65069 (laid open on Mar. 6, 1998), a test carrier is typically formed of a contact sheet (a thin circuit substrate) to be connected to a bare chip when the bare chip is received, a pressing member having a spring for pressing the bare chip against the contact sheet with predetermined pressure, and a housing for receiving or retaining the contact sheet and the pressing member. The contact sheet of a test carrier has bumps such as of solder for connecting to electrode pads of a bare chip. The connection is made by hard contact between the electrode pads of the bare chip and the bumps of the contact sheet caused by the pressing member.

The electric characteristics are tested by connecting the electrodes of the contact sheet of the test carrier to testing equipment.

In case of such a conventional test carrier, since the electrode pads of the bare chip are made of thin film of aluminum or copper, their surfaces are liable to natural oxidation. This causes a problem in that, in case that electrode pads of a bare chip and bumps of a contact sheet are connected, stable test can not be carried out simply by pressing the electrode pads and the bumps with the pressing member, since the connection is poor due to a natural oxide film on the surface. Thus, a need exists for providing stable contact between a bare chip and a contact sheet within a test carrier.

On the other hand, it is necessary to structure a test carrier such that a bare chip such as an LSI, a semiconductor device, or the like can be tested in a state similar to that of a packaged product.

More particularly, in testing a bare chip, in order to lower the cost, it is necessary to use various testing apparatus used in testing a packaged product as it is or with the minimum modification. Thus, a test carrier the size of which is almost the same as that of an ordinary packaged IC or LSI is needed.

As described in the above, a test carrier is required to achieve miniaturization and thinning of the respective parts forming the test carrier, and at the same time, stable contact with a bare chip therein.

Further, in case of a pressing member in a conventional test carrier, the pressing force of a spring necessary between a bare chip and the contact sheet is 9–20 g (gram) per bump. It follows that, if the number of the bumps in the contact sheet is 70, the pressing force totals up to 1.3 kg at the maximum. Taking into consideration the dimensional tolerance of the test carrier, pressing force larger than or equal to 1.3 kg is necessary. The pressing force is generated by the spring, and thus, springs having a large spring constant are necessary.

However, in case that conventional springs that meet the Japanese Industrial Standards, for example, are used, in order to obtain sufficient spring characteristics (pressing force and a spring constant), the size of the springs must be large, which limits miniaturization of the test carrier. Conventionally, using a nonstandardized spring is out of the question.

Further, conventionally, a test carrier is entirely (except for the contact sheet) formed of a resin material, but, since the resin material is liable to distortion when pressed by springs, attempt to decrease the distortion makes it difficult to thin the test carrier.

SUMMARY OF THE INVENTION

Accordingly, an object of the invention is to provide a test carrier which can materialize stable contact between a semiconductor device such as a bare chip and a contact sheet, and to provide a method of mounting a semiconductor device thereon.

Another object of the invention is to provide a test carrier which achieves miniaturization and thinning thereof, and at the same time, stable contact with a semiconductor device therein.

For the purpose of testing, a semiconductor device having first terminals on the surface is mounted on a test carrier according to the present invention. The test carrier has a carrier base, a contact sheet disposed on the carrier base, a pressure applying member, and a securing member. The contact sheet is opposed to the semiconductor device, and has second terminals in contact with and connected to the first terminals of the semiconductor device and external electrodes for testing. The pressure applying member applies predetermined contact pressure between the first terminals of the semiconductor device and the second terminals of the contact sheet. The securing member secures the contact sheet on the carrier base.

The present invention is particularly characterized in that the center of thermal expansion of the contact sheet secured by the securing member is offset from all the second terminals of the contact sheet.

With this structure, due to the difference between the coefficient of thermal expansion of the second terminals of the contact sheet and that of the first terminals of the bare chip, the second terminals of the contact sheet (or the first terminals of the semiconductor device) slightly move, scraping or scrubbing the surface of all the first terminals of the semiconductor device (or of all the second terminals of the contact sheet). As a result, an oxide film formed on the surfaces of all the first terminals (or of all the second terminals) is removed.

According to another aspect of the present invention, a test carrier comprises a carrier base, a contact sheet disposed on the carrier base, opposed to a semiconductor device, and having second terminals in contact with and connected to first terminals of the semiconductor device and external electrodes for testing, a pressure applying member for applying predetermined contact pressure between the first terminals and the second terminals, and a securing member for securing the contact sheet on the carrier base. Further, the securing member secures the carrier base and the contact sheet at two or more securing points, and the center of a figure formed by linking the securing points is offset from all the second terminals.

The present invention has an effect similar to that of the invention described in the above.

A mounting method according to the present invention is a method of mounting on a test carrier a semiconductor device to be tested having first terminals on the surface. The mounting method uses a test carrier including a contact sheet opposed to the semiconductor device and having second terminals in contact with and connected to the first terminals of the semiconductor device and external electrodes for testing. Further, the securing positions of a securing member for securing the contact sheet on the carrier base of the test carrier are determined such that the center of thermal expansion of the contact sheet is offset from all the second terminals of the contact sheet, and the semiconductor device and the test carrier are retained with predetermined contact pressure applied between the first terminals and the second terminals. With the retaining state being maintained, by heating at least the contact sheet, the contact sheet is expanded to form scrapes at all the contact portions between the first terminals and the second terminals.

DETAILED DESCRIPTION OF THE PREFERRED EMBODIMENTS

Figure 1:
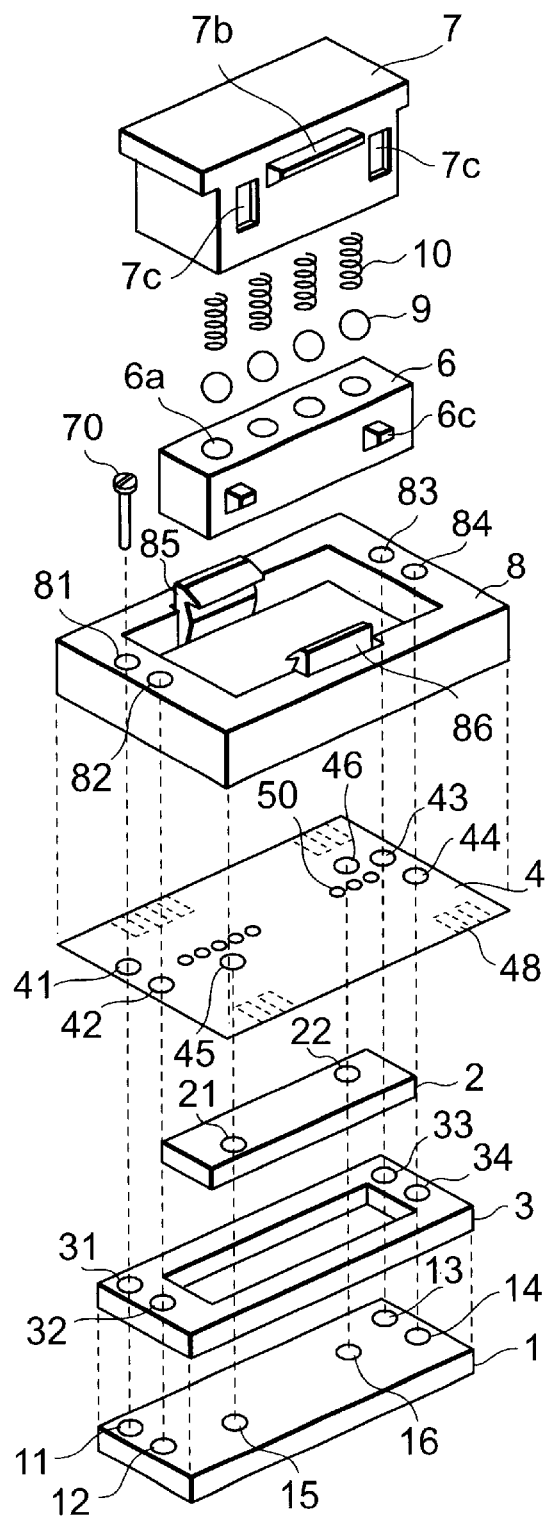
FIG. 1 is an exploded perspective view of an embodiment of a test carrier according to the present invention.
Figure 2:
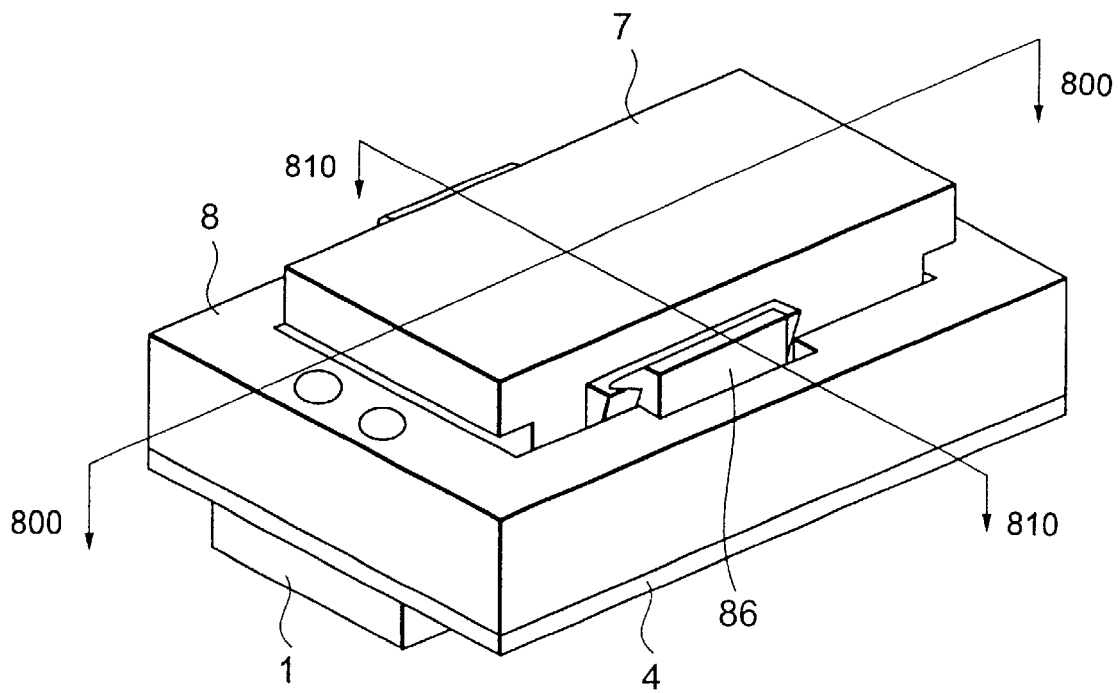
FIG. 2 is a perspective view of the assembled test carrier shown in FIG. 1.
Figure 3:
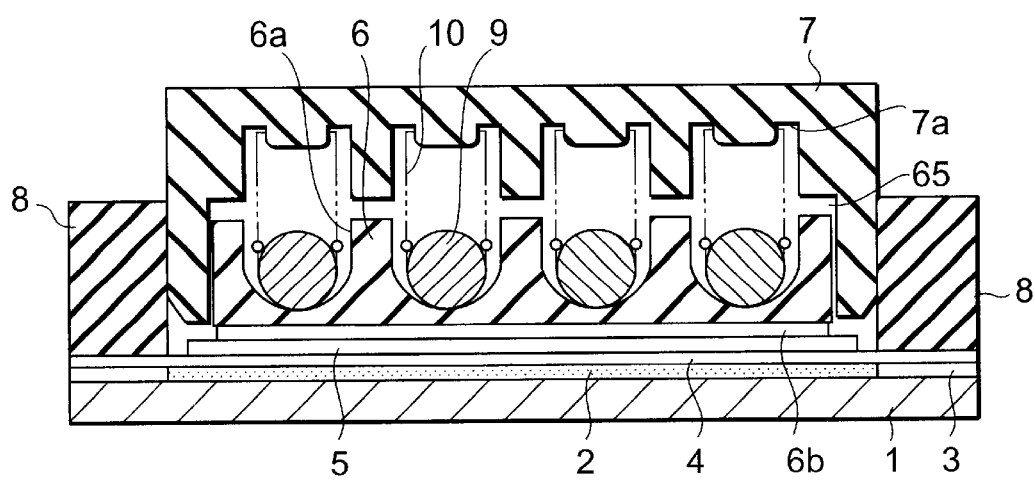
FIG. 3 is a sectional view taken along the line of 800—800 in FIG. 2.
Figure 4:
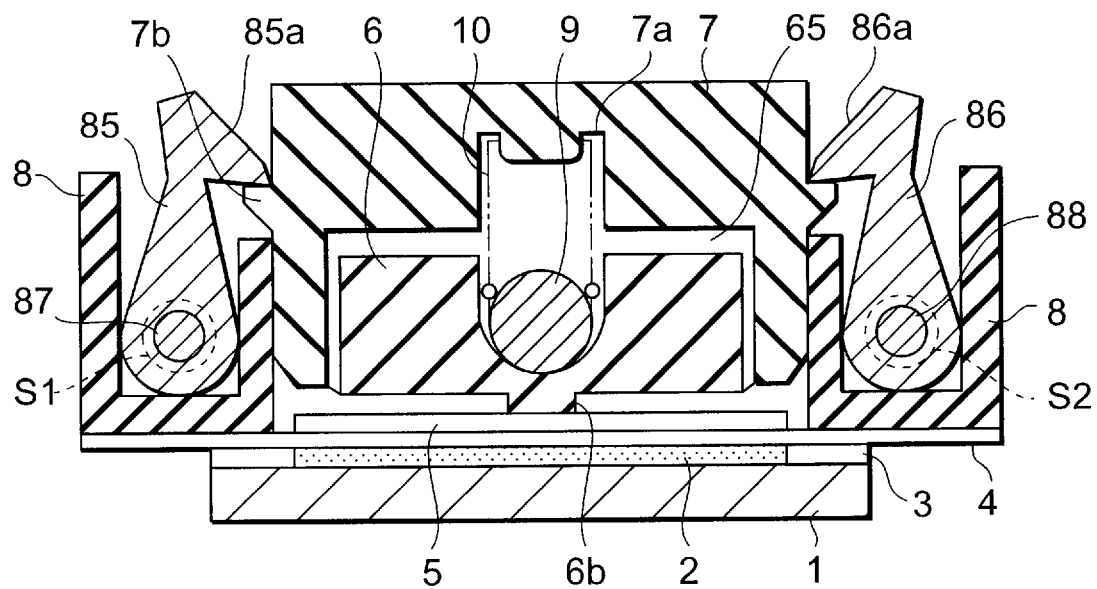
FIG. 4 is a sectional view taken along the line 810—810 in FIG. 2.

FIG. 1 is an exploded perspective view of an embodiment of a test carrier according to the present invention. FIG. 2 is a perspective view of the assembled test carrier shown in FIG. 1. FIG. 3 is a sectional view taken along the line of 800—800 in FIG. 2. FIG. 4 is a sectional view taken along the line 810—810 in FIG. 2

In FIG. 1, a carrier base 1 made of stainless steel is at the bottom of the test carrier. Silicon elastomer 2 as an elastic member and a buffer member and an elastomer supporting member 3 made of polyethylene based resin for retaining the elastomer 2 from periphery are disposed on the carrier base 1.

Figure 6:
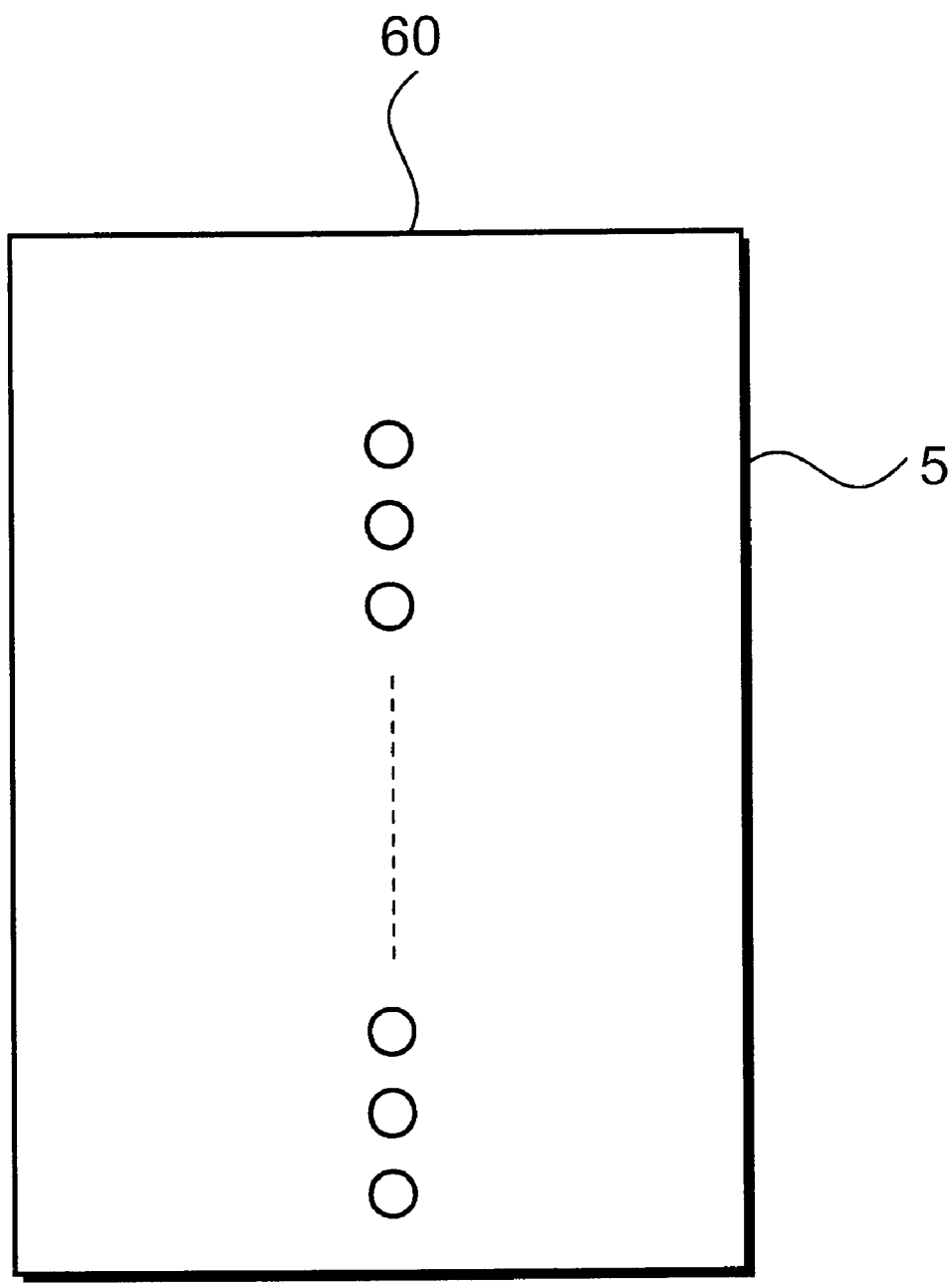
FIG. 6 is an enlarged sectional view of a bare chip.

A contact sheet 4 for connecting a bare chip 5, which is the object of a test and shown in FIG. 6, is mounted on the elastomer 2. The bare chip 5 shown in FIG. 6 is obtained by forming circuit patterns on a wafer, testing the wafer, and dicing the wafer. Electrode pads 60 (first terminals) of aluminum are formed on a center line of the bare chip 5.

Figure 5:
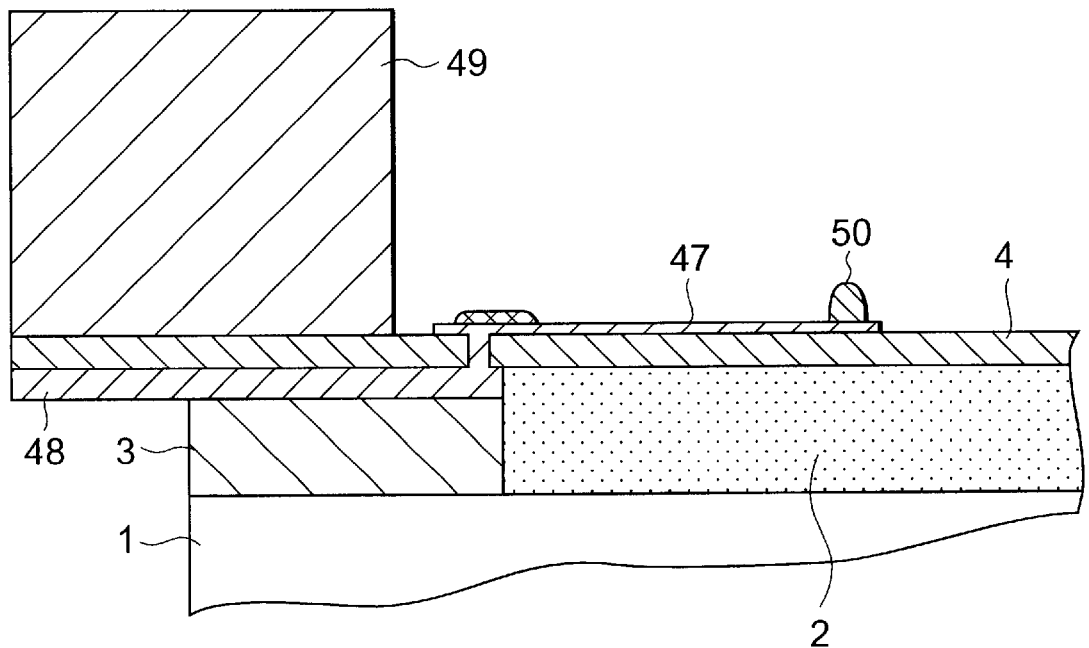
FIG. 5 is an enlarged sectional view of an edge portion of a flexible sheet of the test carrier shown in FIG. 1.

The contact sheet 4 is a sheet made of polyimide and as thin as several dozen to several hundred microns. A plurality of bumps 50 (second terminals) to be connected to the electrode pads 60 of the bare chip 5 are formed on the surface of the contact sheet 4. As shown in the enlarged view of FIG. 5, a frame portion 49 with the thickness of 0.5 mm is formed on the edge of the surface of the contact sheet 4 for the purpose of tensioning the contact sheet 4. The bumps 50 are connected to corresponding external electrodes 48, respectively, on the contact sheet 4 via wiring patterns 47. The external electrodes 48 are formed on the rear surface of the contact sheet 4 so as to be exposed when the test carrier is assembled.

Again with reference to FIG. 1, a pressure applying member is disposed above the contact sheet 4 (above the bare chip 5 when the bare chip 5 is connected). More specifically, a pressing member 6 having therein springs 10 and balls 9 shown in FIGS. 3 and 4 is disposed above the contact sheet 4, and a carrier cover 7 covers and secures the pressing member 6. The carrier cover 7 fits in a carrier frame 8 to be retained.

The carrier frame 8 as a retaining member of the pressure applying member is secured to the carrier base 1 with four screws 70 (only one of them is shown in FIG. 1). Here, the elastomer supporting member 3 and the contact sheet 4 are also secured with the screws 70.

More specifically, as shown in FIG. 1, the four screws 70 are inserted into threaded holes 11, 12, 13, and 14 in the carrier base 1, threaded holes 31, 32, 33, and 34 in the elastomer supporting member 3, threaded holes 41, 42, 43, and 44 in the contact sheet 4, and threaded holes 81, 82, 83, and 84 in the carrier frame 8 to secure the carrier base 1, the elastomer supporting member 3, the contact sheet 4, and the carrier frame 8. It is to be noted that, if the heads of the screws 70 are on the side of the carrier frame 8, the respective holes in the carrier frame 8 and in the contact sheet 4 are not necessarily required to be threaded.

In the embodiment of the present invention, first, the carrier base 1, the elastomer 2 (the elastomer supporting member 3), the contact sheet 4, and the carrier frame 8 are secured with the screws 70. Next, after the bare chip 5 is disposed on the contact sheet 4, the pressure applying member including the pressing member 6 and the carrier cover 7 fits in the center of the carrier frame 8. It is to be noted that the position of the respective threaded holes for the screws 70 is characteristic, which will be described in the following.

Further, with reference to FIG. 1, suction holes 15 and 16, 21 and 22, and 45 and 46 are formed in the carrier base 1, the elastomer 2, and the contact sheet 4, respectively. These suction holes are for sucking and retaining the bare chip 5 from the side of the carrier base 1 when the bare chip 5 is disposed and positioned on the contact sheet 4.

(Details of Pressing Member 6, Carrier Cover 7, and Carrier Frame 8)

Next, details of the pressing member 6, the carrier cover 7, and the carrier frame 8 will be further described.

As shown in FIGS. 3 and 4, the pressing member 6 has therein the balls 9 and the springs 10 for pressing the balls 9 toward the contact sheet 4 side. Further concavely-structured portions 7a of the carrier cover 7 presses one end of the springs 10. The balls 9 are housed one by one in ball housing portions 6a formed by digging the pressing member 6 so as to be cylindrical. Further, a chip pressing portion 6b is formed in the middle of the bottom surface of the pressing member 6. The chip pressing portion 6b is formed to be protrusion-like so as to press the electrode pads of the bare chip 5 efficiently against the contact sheet 4.

The springs 10 are disposed so as to expand and contract in the direction perpendicular to the surface of the contact sheet 4. Further, there is a stroke (space) 65 which allows the pressing member 6 to move in the direction of expansion and contraction of the springs 10.

Further, as shown in FIG. 1, the pressing member 6 has four engaging protrusions 6c in total on a pair of its side surfaces opposed to each other. The engaging protrusions 6c engage from inside with engaging holes 7c in the carrier cover 7. This makes the pressing member 6 and the carrier cover 7 engage with each other. The engaging holes 7c are formed so as to be elongated in the vertical direction to allow the engaging protrusions 6c to move vertically in the engaging holes 7c. The engaging protrusions 6c are allowed to move vertically so for the purpose of securing the stroke 65 for the springs 10 shown in FIG. 3.

On the other hand, engaging protrusions 7b are also formed on the same side surfaces of the carrier cover 7 where the engaging protrusions 7c are formed. The engaging protrusions 7b engage with claws 85a and 86a at the tip of engagingly retaining portions (also referred to as latches) 85 and 86 of the carrier frame 8. This makes the carrier cover 7 retained by the carrier frame 8.

As shown in FIG. 4, the lower portions of the engagingly retaining portions 85 and 86 of the carrier frame 8 are rotatably retained by shafts 87 and 88 fixed to the carrier frame 8. It is to be noted that the amount of rotation of the engagingly retaining portions 85 and 86 are limited within the carrier frame 8. Further, springs S1 and S2 (shown by broken lines in the figure) for urging the engagingly retaining portions 85 and 86 toward the inside of the carrier frame 8 are fixed around the shafts 87 and 88. The engagingly retaining portions 85 and 86 are allowed to rotate for the purpose of facilitating attachment and detachment of the carrier cover 7 and the pressing member 6 to and from the carrier frame 8, i.e., accomplishing them merely by rotation of the engagingly retaining portions 85 and 86.

As shown in FIG. 1, the inside dimensions of the carrier frame 8 are larger than the dimensions of the bare chip 5 and slightly larger than the dimensions of the carrier covers 7. Further, the dimensions of the bottom surface of the pressing member 6 are equal to or larger than those of the surface of the bare chip 5.

This allows the bare chip 5 to go into the inner edge of the carrier frame 8 and to be mounted in the center of the contact sheet 4. The positioning of the bare chip 5 in this way brings the electrode pads 60 of the bare chip 5 into contact with the bumps 50 of the contact sheet 4. After that, as shown in FIG. 4, the pressure applying member comprising the pressing member 6 and the carrier cover 7 is retained by the engagingly retaining portions 85 and 86 of the carrier frame 8.

As shown in FIGS. 3 and 4, in the state where the pressure applying member is retained by the carrier frame 8, the springs 10 contract and the pressing member 6 connects the electrode pads 60 of the bare chip 5 to the bumps 50 of the contact sheet 4 with the pressing force of the springs 10.

It is to be noted that, when the pressing member 6 presses with the springs 10, the elastomer 2 below the contact sheet 4 acts as a buffer.

Next, the springs 10 and the position of the screws 70 (the threaded holes), which are the characteristics of the embodiment of the present invention, will be described in this order.

(Description of Springs 10)

As the springs 10, material having torsional stress which is larger than the recommendation value according to the Japanese Industrial Standards (=80% or less of the allowable torsional stress) is used. More specifically, the torsional stress of the springs 10 is 80–130% of the allowable torsional stress according to the Japanese Industrial Standards.

In order for the bumps 50 of the contact sheet 4 to be sufficiently in contact with the electrode pads 60 of the bare chip 5, the pressing force per bump provided by the springs 10 is required to be 9.0–20.0 g (preferably 9.4–18.8 g). In order to obtain such pressing force, according to the Japanese Industrial Standards, naturally, springs having a large spring constant are necessary, and thus, conventionally, larger-sized springs are used.

However, according to the embodiment of the present invention, for the purpose of miniaturizing the springs that does not meet the JIS the material of which has larger torsional stress (80–130% of the allowable torsional stress according to the Japanese Industrial Standards) is consciously used for the springs 10, which allows the spring constant to be larger, and thus, the springs 10 can be miniaturized.

Figure 7:
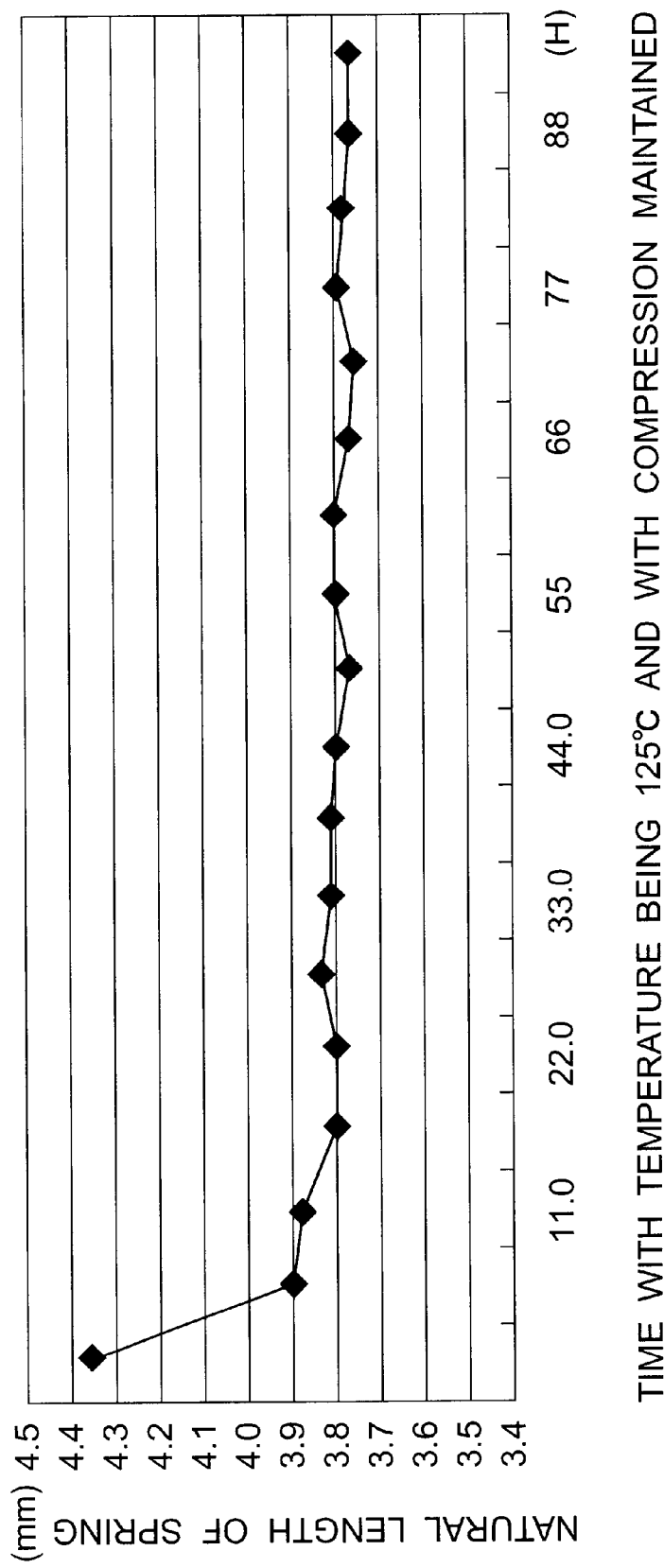
FIG. 7 is a graph showing characteristics of a spring used in the test carrier shown in FIG. 1 in repeated compression tests when heated to 125° C.
Figure 8:
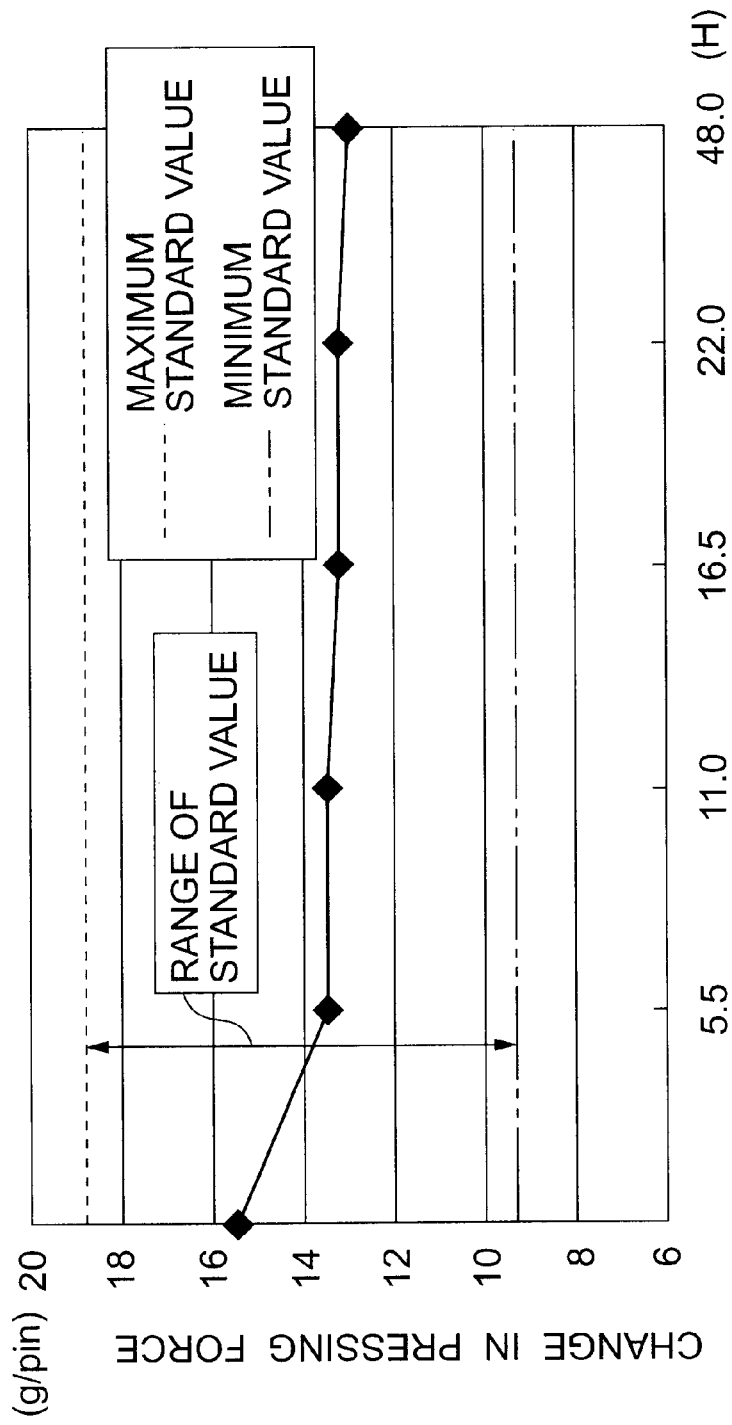
FIG. 8 is a graph showing characteristics of the spring illustrating change in the pressing force in the compression tests when heated to 125° C.

FIG. 7 is a graph showing characteristics of the spring 10 in repeated compression tests when heated to 125° C. FIG. 8 is a graph showing characteristics of the spring 10 illustrating change in the pressing force in repeated compression tests when heated to 125° C. In case that the test carrier according to the embodiment of the present invention is used, as described in the following, there is a preheating process at 125° C. after the bare chip 5 is set thereon. FIGS. 7 and 8 illustrate change in the characteristics of the spring 10 due to the preheating.

As shown in FIG. 7, at a time point where the compression is maintained for about six hours from the beginning with the spring 10 being heated to 125° C., the natural length of the spring (length measured after the spring is once released from the compression) is decreased to 3.9 mm from 4.4 mm measured at the beginning. After that time point, the natural length of the spring does not vary greatly over the long time of continuous heating and compression. On the other hand, the pressing force remains in the preferable range of 9.4–18.8 g over the long time of continuous compression.

This made it clear that, even a spring having the torsional stress of 80–130% of the allowable torsional stress according to the Japanese Industrial Standards is used, the change in the natural length of the spring 10 due to heating scarcely influences in obtaining pressing force in the required range.

(Description of Position of Screws 70)

Figure 9:
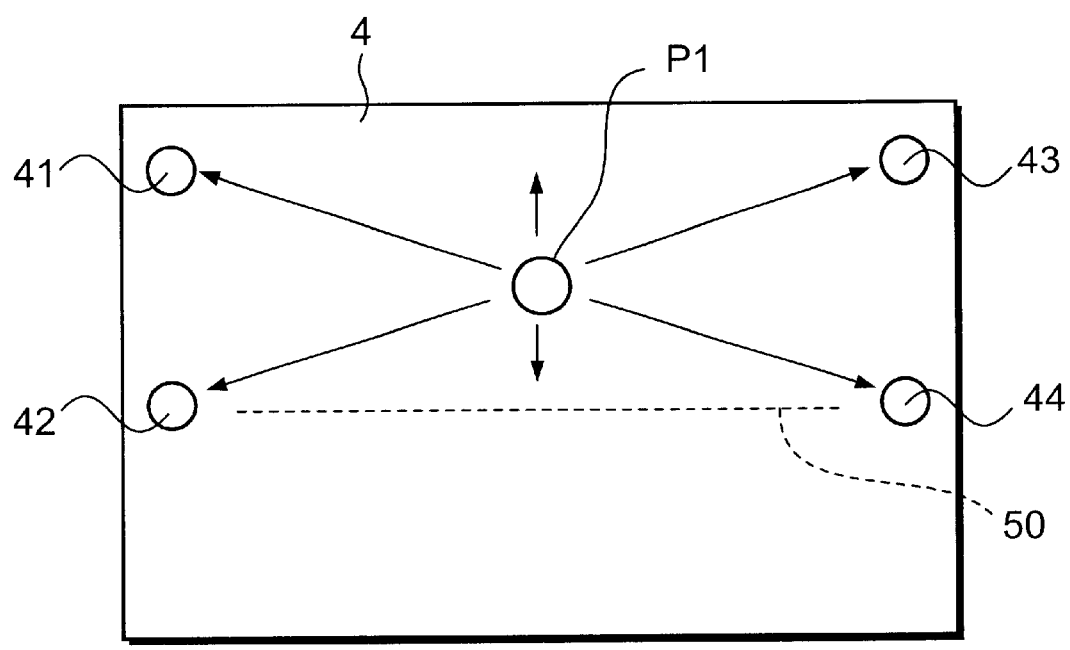
FIG. 9 is a plan view illustrating thermal expansion of a contact sheet according to an embodiment of the present invention.

With reference to FIG. 1, the center of a figure (square) formed by linking the threaded holes in the carrier base 1, the elastomer supporting member 3, the contact sheet 4, and the carrier frame 8 secured with the screws 70 does not overlap the position of the bumps 50 of the contact sheet 4. More specifically, on the contact sheet 4, as shown in FIG. 9, the center P1 of the square formed by linking the threaded holes 41, 42, 43, and 44 does not overlap the position of the bumps 50.

Figure 10:
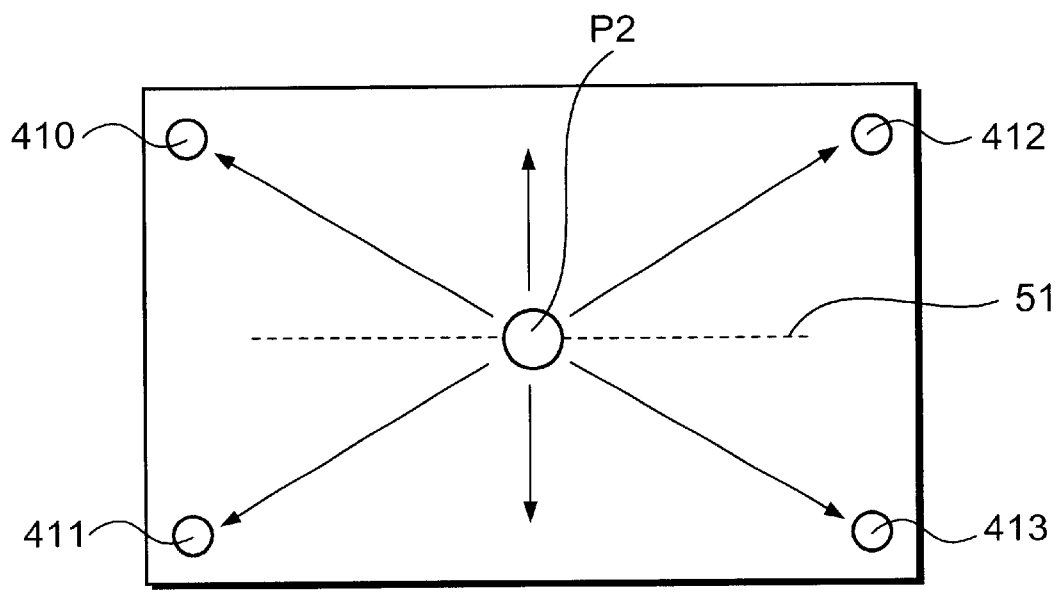
FIG. 10 is a plan view illustrating a reference example of thermal expansion of a contact sheet.

On the other hand, in a reference example shown in FIG. 10, the screws are fixed to the four corners of the contact sheet. Therefore, a center P2 of a square formed by linking threaded holes 410, 411, 412, and 413 overlaps the position of bumps 51.

When the test carrier with a bare chip mounted thereon is heated, the contact sheet 4 fixed with the screws 70 in the threaded holes 41, 42, 43, and 44 expands. In the case shown in FIG. 9, the center of the thermal expansion is the center P1. More specifically, the thermal expansion is caused such that the contact sheet 4 expands in the directions shown by arrows in FIG. 9 with the center P1 being the center of the expansion. As a result, all the bumps 50 on the contact sheet 4 move away from the center P1 due to the thermal expansion of the contact sheet 4.

On the other hand, in the reference example shown in FIG. 10, since the center P2 which is also the center of the thermal expansion overlaps the position of the bumps 51, the bumps 51 near the center P2 scarcely move.

The difference in movement due to the thermal expansion between the cases shown in FIGS. 9 and 10 comes out as the difference in the stability of the connection between the bumps 50 of the contact sheet 4 and the electrode pads 60 of the bare chip 5, which will be described in the following with reference to FIGS. 11 and 12.

Figure 11A:
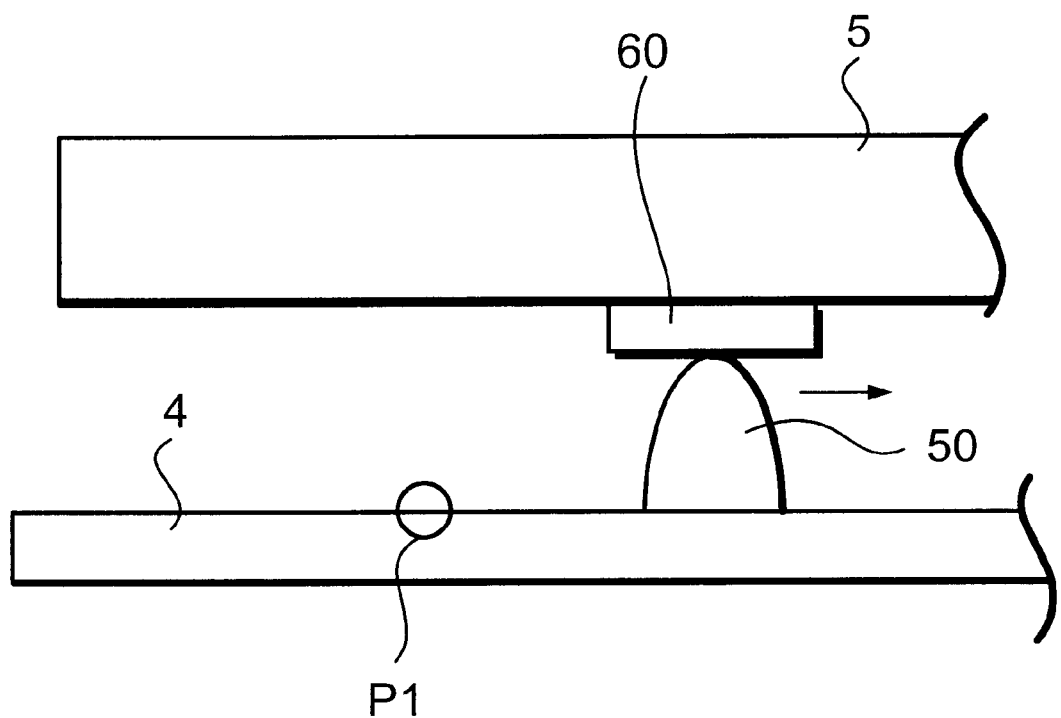
FIG. 11A is a sectional view illustrating thermal expansion of the sheet of the embodiment shown in FIG. 9.
Figure 11B:
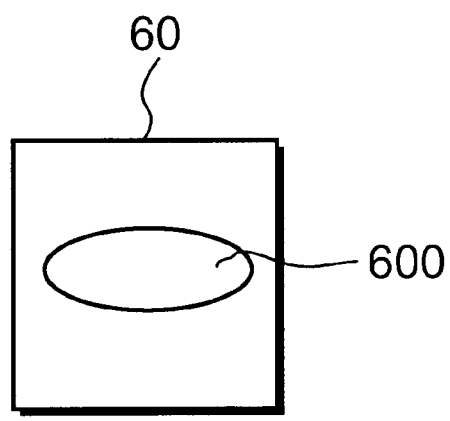
FIG. 11B is a plan view illustrating a scrub formed on an electrode pad shown in FIG. 11A.
Figure 12A:
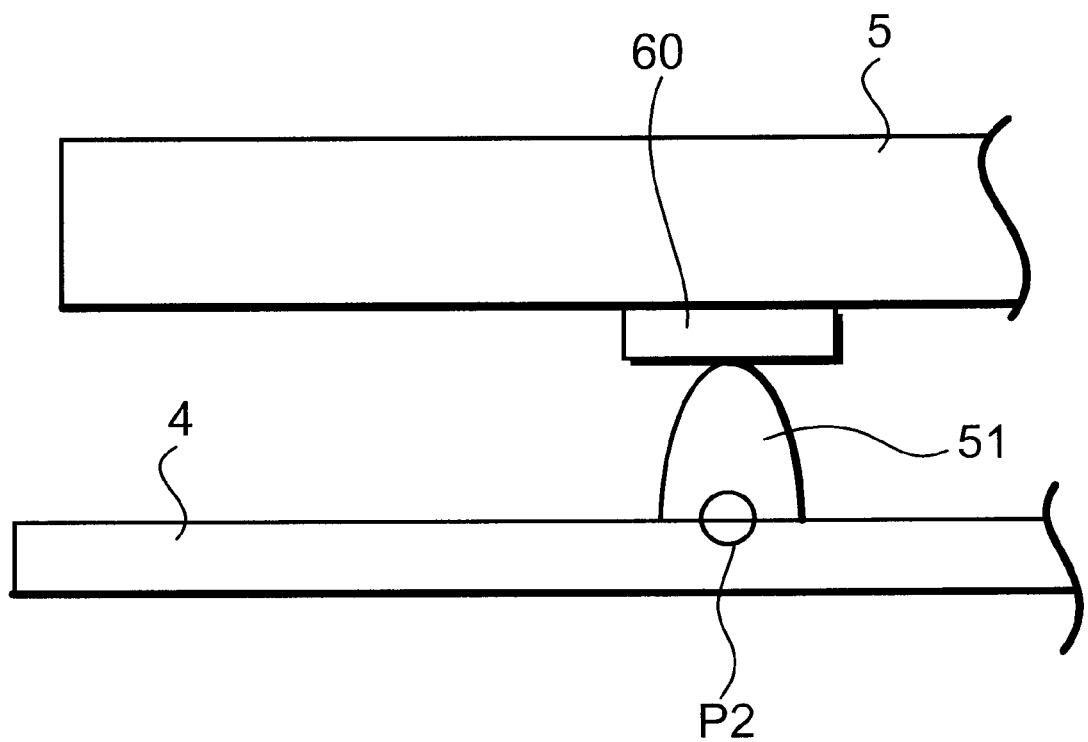
FIG. 12A is a sectional view illustrating thermal expansion of the contact sheet of the reference example shown in FIG. 10.
Figure 12B:
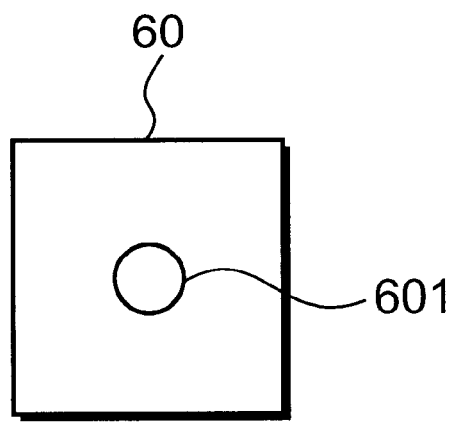
FIG. 12B a plan view illustrating a scrub formed on an electrode pad shown in FIG. 12A.

FIG. 11A is a sectional view of the bare chip 5 and the contact sheet 4 in case that, as in the embodiment of the present invention shown in FIG. 9, the center of the thermal expansion does not overlap the blumps. FIG. 11B is a plan view illustrating the state of the surface of a pad 60 of the bare chip 5 after the thermal expansion. FIG. 12A is a sectional view of the bare chip 5 and the contact sheet 4 in case that, as in the reference example shown in FIG. 10, the center of the thermal expansion overlaps the bumps. FIG. 12B is a plan view illustrating the state of the surface of a pad 60 of the bare chip 5 after the thermal expansion.

As shown in FIG. 11A, in case that the center P1 of the thermal expansion does not overlap the bumps 50, as described in the above, when the contact sheet 4 expands due to the heating, all the bumps 50 move away from the center P1 of the thermal expansion. The movement makes all the tips of the bumps 50 and the electrode pads 60 scrape against each other, and, as shown in FIG. 11B, a scrape 600 is formed in the electrode pad 60. The scrape breaks the oxide film on the surface; of the electrode pad 60, and thus, stable contact between all the electrode pads 60 and the bumps 50 can be obtained.

On the other hand, as shown in FIG. 12A, in case that the center P2 of the thermal expansion overlaps the bumps 51, even when the contact sheet 4 expands due to the heating, bumps 51 near the center P2 of the thermal expansion do not move. As a result, the tips of such bumps 51 and corresponding electrode pads 60 do not scrape against each other, and, as shown in FIG. 12B, no scrape is formed at a contact 601. As a result, the oxide film on the surface of the electrode pads 60 remains unbroken near the center of the thermal expansion, resulting in failure in obtaining stable contact.

As described in the above, in the present embodiment, it is important to thermally expand the contact sheet 4 by heating the test carrier for the purpose of forming scrapes for good contact between the bumps 50 of the contact sheet 4 and the electrode pads 60 of the bare chip 5, and in addition, to make the center of the thermal expansion of the contact sheet 4, which depends on the positions secured with the screws 70 (positions of the threaded holes), overlap none of the bumps 50.

(Method of Mounting Bare Chip 5 on Test Carrier)

Next, a method of mounting the bare chip 5 in FIG. 6 on the test carrier will be described.

First, without setting in the carrier frame 8 the pressure applying member comprising the pressing member 6 and the carrier cover 7, the bare chip 5 is put within the inner edge of the carrier frame 8 to be mounted on the contact sheet 4. Here, alignment is carried out with monitoring with a camera or the like such that the electrode pads 60 (FIG. 6) of the bare chip 5 are in contact with the bumps 50 (FIG. 1) of the contact sheet 4. Further, during the alignment, the bare chip 5 is sucked and retained using the suction holes 15, 16, 21, 22, 45, and 46 in FIG. 1 from below the carrier base 1.

Next, the pressure applying member in which the pressing member 6 and the carrier cover 7 (and, in addition, the balls 9 and the springs 10) are integrated is inserted into the carrier frame 8 from above the bare chip 5 retained by the suction. The pressure applying member is retained when the engaging protrusions 7b (FIG. 1) on the side surfaces of the carrier cover 7 engage with the engagingly retaining portions 85 and 86 of the carrier frame 8.

In this process, pressing of the bare chip 5 against the contact sheet 4 starts when the chip pressing portion 6a (FIG. 3) of the pressing member 6 comes in contact with the rear surface of the bare chip 5. When the pressure applying member is retained by the carrier frame 8, the springs 10 are compressed by a predetermined amount, and pressing force of 9.4 to 18.8 g is applied to each of the bumps 50 of the contact sheet 4 by the electrode pads 60 of the bare chip 5.

Thus, the bare chip 5 is pressed from above by the pressing member 6 with proper pressure. At this time point, the suction of the bare chip 5 through the suction holes ends, and the mounting of the bare chip 5 completes.

Next, the test carrier with the bare chip 5 mounted thereon is put in a high temperature vessel to carry out preheating. The preheating is carried out, for example, by leaving the test carrier in a high temperature vessel at 125° C. for three minutes. This leads to expansion of the contact sheet 4, forming of scrapes on the surfaces of the electrode pads 60 of the bare chip 5 with the tips of the bumps 50 as shown in FIGS. 11A and 11B, and breakage of the oxide film on the surfaces of the electrode pads 60, and thus, stable contact can be obtained with regard to all the bumps 50. It is to be noted that, though the bare chip 5 also expands by the preheating, the coefficient of thermal expansion of the bare chip 5 differs from that of the contact sheet 4, and typically, the contact sheet 4 expands more.

The preheating is for the purpose of scraping the oxide film as shown in FIG. 11B between the electrode pads 60 and the bumps 50, and the temperature of the preheating may be other than 125° C., but the temperature is selected such that the bumps. 50 and the electrode pads 60 themselves do not melt.

After the preheating, the test carrier is connected to testing equipment via the external terminals 48 (FIG. 1) of the contact sheet 4 to determine whether the bare chip 5 is nondefective or defective.

It is to be noted that the preheating of the test carrier may be carried out other than by leaving it in a high temperature vessel. For example, the test carrier may be heated from the side of the pressing member or from the side of the carrier base i using a contact heating jig.

(Description of other Embodiments)

The present invention is not limited to the embodiment described in the above. For example, though, in the above embodiment, the protrusion-like bumps 50 are formed on the contact sheet 4 while the flat electrode pads are formed on the bare chip 5, bumps may be formed on the bare chip 5 and electrode pads may be formed on the contact sheet 4. In short, it is preferable that bumps are formed on at least one of the contact sheet and the bare chip in order to form scrapes. Further, the shape of the bumps is not limited. For example, the number of the protrusions in a bump may be one or more.

Further, the array of the electrode pads 60 of the bare chip 5 (and the array of the pads 50 of the contact sheet 4) may be located other than on the center line as shown in FIG. 1. It is important to make the center of the thermal expansion of the contact sheet 4 overlap none of the bumps or the pads.

Further, conventional springs which meet the Japanese Industrial Standards may be used as the springs 10 if stable contact between the electrodes of the bare chip 5 and of the contact sheet 4 is just expected and miniaturization of the test carrier is not expected.

Further, although the contact sheet 4 may be a rigid circuit substrate or may be a flexible sheet, in view of miniaturizing, it is preferable to make the contact sheet 4 as thin as possible.

Further, the retaining member for retaining the pressure applying member which presses the bare chip against the contact sheet side may engage the pressure applying member without the engagingly retaining portions 85 and 86 of the carrier frame 8 but with other retaining structures. Further, the shape of the retaining member for retaining the pressure applying member may be other than a frame.

Although the direction of force exerted by the pressure applying member of the above embodiment is from the side of the bare chip to the side of the contact sheet, the pressure applying member may be structured such that the direction of the force is from the side of the contact sheet to the side of the bare chip.

Further, though the carrier base 1, the elastomer 2, and the elastomer supporting member 3 are separate from one another in the above embodiment, they may be integrated.

Further, though the carrier base 1, the elastomer supporting member 3, the contact sheet 4, and the carrier frame 8 are secured using the screws 70, pins may be used instead of the screws.

In this case, the pins may be formed in the carrier base 1. More specifically, the elastomer supporting member 3, the contact sheet 4, and the carrier frame 8 may be secured with the pins in the carrier base 1. Alternatively, the pins may be subsequently inserted into the respective threaded holes shown in FIG. 1.

Still further, though there are four securing points where securing members such as the screws, pins, or the like are secured in the present embodiment, the number of the securing points may be two or more.

DESCRIPTION OF EFFECTS

According to the present invention, the securing member secures the carrier base and the contact sheet at two or more securing points, and the center of a figure formed by linking the securing points is offset from all the second terminals. This makes it possible to obtain stable contact between terminals of the semiconductor device and of the contact sheet simply by securing at the securing points and by heating.

As described in the above, a test carrier according to the present invention comprises a contact sheet disposed on a carrier base and having second terminals in contact with and connected to first terminals on the surface of a semiconductor device and external electrodes for testing, a pressure applying member for applying predetermined contact pressure between the first and second terminals, and a securing member for securing the contact sheet on the carrier base. The center of thermal expansion of the contact sheet secured by the securing member is offset from all the second terminals. This makes it possible to, even if the first terminals are on a center line of the semiconductor device, form scrapes between all the first terminals and second terminals by heating to remove an oxide film, and thus, reliable and stable contact can be obtained.

Further, since the securing member secures the carrier base and the contact sheet at two or more securing points and the center of a figure formed by linking the securing points is offset from the second terminals, scrapes are formed between all the first terminals and second terminals by heating to remove the oxide film, and thus, reliable and stable contact can be obtained.

Further, the pressure applying member has springs for applying predetermined contact pressure between the first and second terminals. By making the torsional stress of the springs to be 80–130% of the allowable torsional stress according to the Japanese Industrial Standards, the spring can be miniaturized, and thus, the test carrier can be miniaturized. Even when the springs are heated, proper pressing force can be maintained.

What is claimed is:

1. A test carrier for mounting thereon a semiconductor device having first terminals on a surface for the purpose of testing said semiconductor device, comprising:

a carrier base;

a contact sheet disposed on said carrier base, opposed to said semiconductor device, and having second terminals to be in contact with and connected to said first terminals of said semiconductor device and external electrodes for testing;

a pressure applying member for applying predetermined contact pressure between said first terminals and said second terminals;

a retaining member for detachably retaining said pressure applying member, said semiconductor device being enclosed with said retaining member and said pressure applying member; and a securing member for securing said contact sheet on said carrier base, wherein said retaining member is secured to said carrier base with said securing member and wherein the center of thermal expansion of said contact sheet secured by said securing member is offset from all said second terminals.

2. The test carrier as claimed in claim 1, wherein at least one of said first terminals and said second terminals are bumps.

3. The test carrier as claimed in claim 1, wherein said first terminals are formed at least on a center line on the surface of said semiconductor device.

4. The test carrier as claimed in claim 1, wherein said securing member is screws for securing said carrier base and said contact sheet.

5. The test carrier as claimed in claim 1, wherein said securing member is pins for securing said carrier base and said contact sheet.

6. The test carrier as claimed in claim 1, wherein said pressure applying member has springs for applying predetermined contact pressure between said first terminals and said second terminals, the torsional stress of said springs being 80–130% of the allowable torsional stress according to the Japanese Industrial Standards.

7. The test carrier as claimed in claim 1, wherein said pressure applying member comprises a pressing member having therein springs for applying predetermined contact pressure between said first terminals and said second terminals by pressing said semiconductor device against said contact sheet said, and a cover for securing the stroke for said springs and for retaining said springs in said pressing member, wherein the torsional stress of said springs is 80–130% of the allowable torsional stress according to the Japanese Industrial Standards.

8. The test carrier as claimed in claim 1, wherein said carrier base is made of stainless steel.

9. A test carrier for mounting thereon a semiconductor device having first terminals on the surface for the purpose of testing said semiconductor device, comprising:
   a carrier base;
   a contact sheet disposed on said carrier base, opposed to said semiconductor device, and having second terminals in contact with and connected to said first terminals of said semiconductor device and external electrodes for testing;
   a pressure applying member for applying predetermined contact pressure between said first terminals and said second terminals;
   a retaining member for detachably retaining said pressure applying member, said semiconductor device being enclosed with said retaining member and said pressure applying member; and
   a securing member for securing said contact sheet on said carrier base, wherein said securing member secures said carrier base and said contact sheet at two or more securing points, and the center of a figure formed by linking said securing points is offset from all said second terminals, and wherein said retaining member is secured to said carrier base with said securing member.

10. The test carrier as claimed in claim 9, wherein at least one of said first terminals and said second terminals are bumps.

11. The test carrier as claimed in claim 9, wherein said first terminals are formed at least on a center line on the surface of said semiconductor device.

12. The test carrier as claimed in claim 9, wherein said securing member is screws for securing said carrier base and said contact sheet.

13. The test carrier as claimed in claim 9, characterized in that said securing member is pins for securing said carrier base and said contact sheet.

14. A test carrier as claimed in claim 9, wherein said pressure applying member has springs for applying predetermined contact pressure between said first terminals and said second terminals, the torsional stress of said springs being 80–130% of the allowable torsional stress according to the Japanese Industrial Standards.

15. The test carrier as claimed in claim 9, wherein said pressure applying member comprises a pressing member having therein springs for applying predetermined contact pressure between said first terminals and said second terminals by pressing said semiconductor device against said contact sheet side, and a cover for securing the stroke for said springs and for retaining said springs in said pressing member, and wherein the torsional stress of said springs is 80–130% of the allowable torsional stress according to the Japanese Industrial Standards.

16. The test carrier as claimed in claim 9, wherein said carrier base is made of stainless steel.

17. A method of mounting on a test carrier a semiconductor device to be tested having first terminals on the surface, comprising the steps of:
   preparing said test carrier comprising a contact sheet opposed to said semiconductor device and having second terminals in contact with and connected to said first terminals of said semiconductor device and external electrodes for testing;
   determining the securing positions of a securing member for securing said contact sheet on said carrier base of said test carrier such that the center of thermal expansion of said contact sheet is offset from all said second terminals;
   retaining said semiconductor device and said test carrier with predetermined contact pressure applied between said first terminals and said second terminals; and
   with the retaining state being maintained, expanding said contact sheet to form scrapes at all the contact portions between said first terminals and said second terminals by heating at least said contact sheet.

18. The mounting method as claimed in claim 17, wherein said securing member secures said carrier base and said contact sheet at two or more securing points, and the center of a figure formed by linking said securing points is offset from said second terminals.

19. The mounting method as claimed in claim 17, characterized in that springs are used for the purpose of applying predetermined contact pressure between said first terminals and said second terminals, the torsional stress of said springs being 80–130% of the allowable torsional stress according to the Japanese Industrial Standards.

20. A test carrier for testing a semiconductor device, comprising:
   a carrier base;
   an elastomer positioned on said carrier base for supporting a semiconductor device;
   a contact sheet stretched over said elastomer, said contact sheet having a plurality of contacts for contacting conductors on a semiconductor device;
   a carrier frame positioned over said contact sheet, said carrier frame having an opening therein for accommodating a semiconductor device;
   a plurality of securing members for securing said carrier base, said contact sheet, and said carrier frame together, said securing members securing said contact sheet in a manner whereby a center of thermal expansion of said contact sheet overlaps none of the plurality of contacts on said contact sheet;
   a pressing member positioned within said opening of said carrier frame for applying pressure to a semiconductor device positioned within said carrier frame towards said contact sheet.

21. The test carrier recited in claim 20 wherein said carrier base, said elastomer, and said contact sheet include suction holes for applying a suction through said carrier base, said elastomer, and said contact sheet to a semiconductor device to be positioned on said contact sheet.

22. The test carrier recited in claim 20 further comprising a carrier cover positioned over said pressing member; a
   a plurality of springs disposed between said carrier cover and said pressing member; and
   a plurality of connectors which connect said carrier cover to said pressing member in a fashion where there is a space between said carrier cover and said pressing member which is traversed by said plurality of springs, said plurality of connectors allow vertical movement between said carrier cover and said pressing member.

23. The test carrier recited in claim 22 further comprising a retainer for selectively securing said carrier cover to said carrier frame.

24. The test carrier recited in claim 23 wherein said retainer is rotatable.

* * * * *